United States Patent
Coushaine et al.

(10) Patent No.: US 7,795,632 B2
(45) Date of Patent: Sep. 14, 2010

(54) LIGHT EMITTING DIODE WITH DIRECT VIEW OPTIC

(75) Inventors: Charles M. Coushaine, Rindge, NH (US); Ralph Johnson, Bedford, NH (US); Thomas Tessnow, Weare, NH (US)

(73) Assignee: Osram Sylvania Inc., Danvers, MA (US)

( * ) Notice: Subject to any disclaimer, the term of this patent is extended or adjusted under 35 U.S.C. 154(b) by 543 days.

(21) Appl. No.: 11/474,553

(22) Filed: Jun. 26, 2006

(65) Prior Publication Data

US 2007/0295978 A1 Dec. 27, 2007

(51) Int. Cl.
*H01L 23/31* (2006.01)

(52) U.S. Cl. .......................... 257/98; 257/99; 257/100; 257/433; 257/E25.028; 257/E23.123; 438/26; 438/27; 438/116; 362/294; 362/346; 250/216; 250/239

(58) Field of Classification Search ................ 257/98, 257/99, 100, 666, 431, 432, 433, 434, 678, 257/680, 137, 787, 88, E25.028, E23.123; 362/294, 346; 250/216, 239; 438/26, 27, 438/116
See application file for complete search history.

(56) References Cited

U.S. PATENT DOCUMENTS

| | | | | |
|---|---|---|---|---|
| 6,428,189 B1 * | 8/2002 | Hochstein | .................... | 362/373 |
| 6,517,218 B2 * | 2/2003 | Hochstein | .................... | 362/294 |
| 6,560,038 B1 * | 5/2003 | Parkyn et al. | ................ | 359/726 |
| 6,717,256 B1 * | 4/2004 | Suzuki et al. | ................ | 257/691 |
| 6,727,643 B2 * | 4/2004 | Suehiro | ....................... | 313/499 |
| 7,347,589 B2 * | 3/2008 | Ge | .............................. | 362/294 |
| 7,391,153 B2 * | 6/2008 | Suehiro et al. | .............. | 313/512 |
| 7,425,727 B2 * | 9/2008 | Shoji et al. | ..................... | 257/82 |
| 7,438,447 B2 * | 10/2008 | Holder et al. | ............... | 362/346 |
| 7,499,288 B2 * | 3/2009 | Tanaka et al. | ............... | 361/767 |
| 2004/0246744 A1 | 12/2004 | Krupa | | |
| 2005/0100288 A1 | 5/2005 | Chu | | |
| 2005/0173719 A1 * | 8/2005 | Yonekubo et al. | ............. | 257/98 |
| 2005/0224821 A1 | 10/2005 | Sakano | | |

(Continued)

FOREIGN PATENT DOCUMENTS

GB 1409793 10/1975

(Continued)

*Primary Examiner*—Davienne Monbleau
*Assistant Examiner*—Eduardo A Rodela
(74) *Attorney, Agent, or Firm*—William H. McNeill; William E. Meyer

(57) ABSTRACT

An LED and light guide assembly has an LED with an output surface; a first power input lead electrically coupled to a first pole and having a first surface and a second surface; and a second power input lead electrically coupled to a second pole and having a first surface and a second surface. A unitary, molded light guide has an axially extending, light transmissive body with a light output window. An input window is formed with the unitary, molded light guide being aligned in a zero-gap relationship to capture substantially all the light emitted by the LED. A support is formed integral with the light guide and envelopes a portion of the first surface and the second surface of the first power input lead and the first surface and the second surface of the second power input lead to anchor the guide with respect to the power inputs.

5 Claims, 4 Drawing Sheets

U.S. PATENT DOCUMENTS

| | | |
|---|---|---|
| 2005/0231983 A1 | 10/2005 | Dahm |
| 2005/0232563 A1 | 10/2005 | Kunze |
| 2005/0239227 A1 | 10/2005 | Aanegola |
| 2005/0242452 A1 | 11/2005 | Takase |
| 2005/0243570 A1 | 11/2005 | Chaves |
| 2005/0245018 A1 | 11/2005 | Bogner |
| 2005/0253130 A1 | 11/2005 | Tsutusumi |
| 2005/0259198 A1 | 11/2005 | Lubart |
| 2005/0274973 A1 | 12/2005 | Takahashi |
| 2005/0280014 A1 | 12/2005 | Park |
| 2006/0022212 A1 | 2/2006 | Waitl |
| 2006/0024851 A1 | 2/2006 | Augburger |
| 2006/0091414 A1* | 5/2006 | Ouderkirk et al. ............. 257/99 |
| 2006/0158896 A1 | 7/2006 | Krupa |

FOREIGN PATENT DOCUMENTS

| | | |
|---|---|---|
| JP | 56081809 | 12/1979 |
| JP | 60246685 | 5/1984 |
| JP | 59229509 | 12/1984 |
| JP | 02049478 | 7/1988 |
| JP | 04002179 | 4/1990 |
| WO | WO 97/40529 | 10/1997 |
| WO | WO 03/056638 A2 | 7/2003 |

* cited by examiner

LIGHT EMITTING DIODE WITH DIRECT VIEW OPTIC

TECHNICAL FIELD

This invention relates generally to light sources and more particularly to light emitting diode (LED) light sources. Still more particularly, it relates to LED light sources integrally combined with light guides.

BACKGROUND ART

LEDs have frequently been employed with various light modifying media such as optic fibers and light guides to direct, amplify or otherwise position the light output from the LED. The major problem that occurs in such constructions is the loss of light that is occasioned between the output surface of the LED and the input surface of the light modifying media. Even employing the best available optical binding agents and gels does not eliminate this loss effect. Therefore, it would be an advance in the art if this light loss could be eliminated or substantially reduced.

DISCLOSURE OF THE INVENTION

It is, therefore, an object of this invention to obviate the disadvantages of the prior art.

It is another object of the invention to enhance the light output of LED-light guide combinations.

These objects are accomplished, in one aspect of the invention, by an LED and light guide assembly, comprising: an LED with an output surface; a first power input lead electrically coupled to a first pole of the LED and having a first surface and a second surface, a second power input lead electrically coupled to a second pole of the LED and having a first surface and a second surface; a unitary, molded light guide having an axially extending, light transmissive guide body with an internally reflective surface, the guide body having a light output window; an input window formed with the unitary, molded light guide being aligned to capture substantially all the light emitted by the LED at the output surface; and a support integral with the light guide and enveloping at least a portion of the first surface and the second surface of the first power input lead and the first surface and the second surface of the second power input lead to anchor the guide body with respect to the power inputs.

This construction couples the light guide to the output surface of the LED in a zero-gap relationship insuring that substantially all of the light emitted by the LED enters the input window of the light guide. Additionally, the integral formation of the support with the light guide insures that this alignment will be maintained when the assembly is mounted upon a printed circuit board or other substrate.

BEST MODE FOR CARRYING OUT THE INVENTION

For a better understanding of the present invention, together with other and further objects, advantages and capabilities thereof, reference is made to the following disclosure and appended claims taken in conjunction with the above-described drawings.

Figure 1:
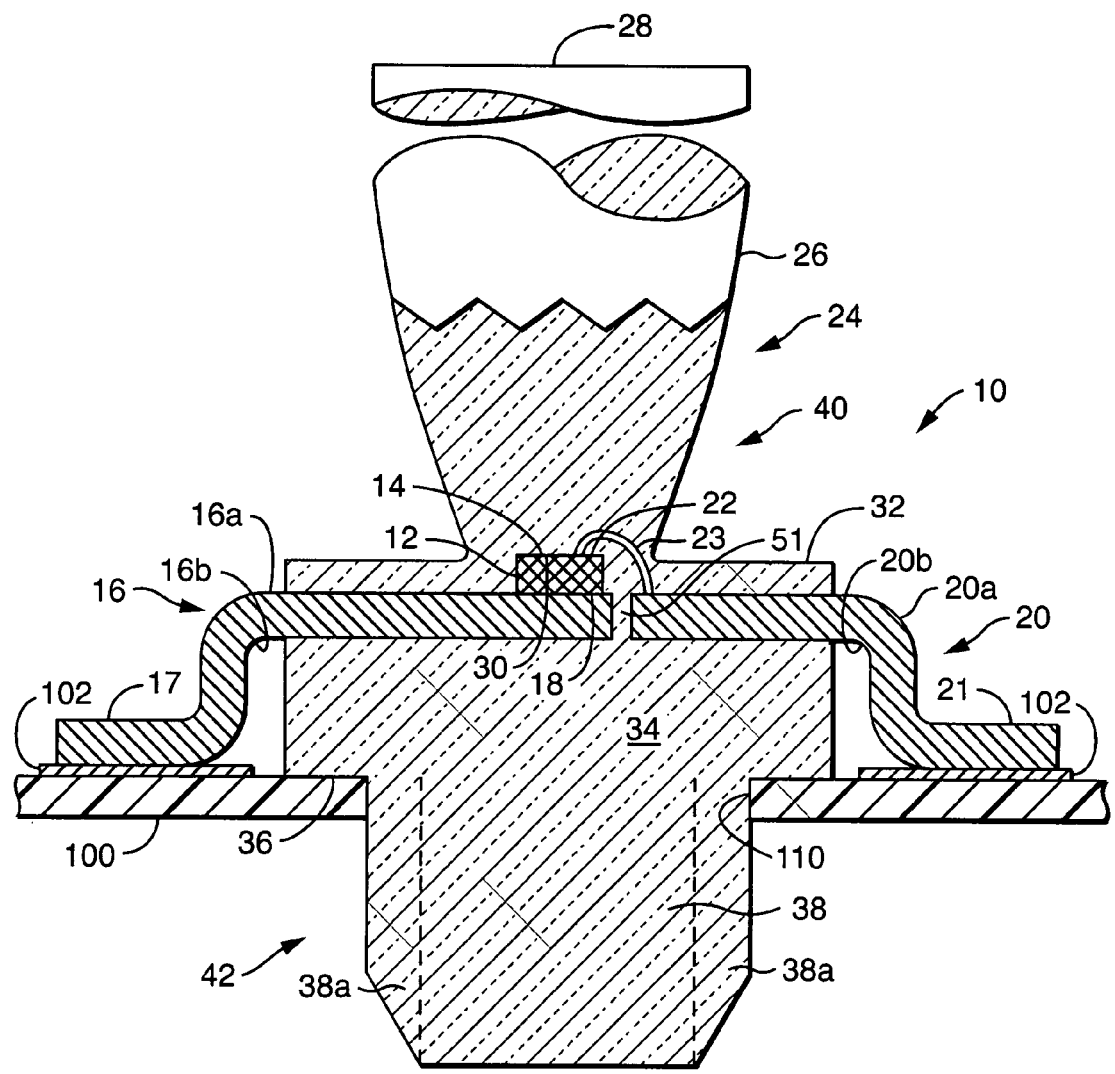
FIG. 1 is an enlarged, diagrammatic, sectional view of an embodiment of the invention.

Referring now to the drawings with greater particularity, there is shown in FIG. 1 an LED and light guide assembly 10, comprising: an LED 12 with an output surface 14. A first power input lead 16 is electrically coupled to a first pole 18 of the LED 12. The first power input lead 16 has a first surface 16a and a second surface 16b. A second power input lead 20 is electrically coupled to a second pole 22 of the LED 12, for example, by a wire 23, and has a first surface 20a and a second surface 20b. The power input leads 16 and 20 are preferably formed from a material having a high thermal conductivity since they can function also as a heat sink. While many materials can thus qualify, fabrication of the power input leads from a copper alloy is preferred. After formation of the input power leads they can be coated or plated to eliminate oxidation and have the requisite electrical contact pads applied to receive the LED chip and wire bonds.

A unitary, molded light guide 24 cooperates with the LED 12 and has an axially extending, light transmissive guide body 26, using total internal reflection to guide and redirect the light with a light output window 28. An input window 30 is formed with the unitary, molded light guide 24 and is aligned in a zero light gap relationship with the LED 12 to capture substantially all the light emitted from the top and side surfaces of the LED 12 at the output surface 14. A support 32 is integral with the light guide 24 and envelopes at least a portion of the first surface 16a and the second surface 16b of the first power input lead 16 and the first surface 20a and the second surface 20b of the second power input lead 20 to anchor the guide body with respect to said power input leads 16 and 20. Preferably the light guide body 26 is formed as a complex parabolic concentrator, as described in co-pending patent application Ser. No. 11/443,833, filed May 31, 2005, which is base on and claims priority from Provisional Application Ser. No. 60/705,744, filed Aug. 5, 2005.

Figure 5:
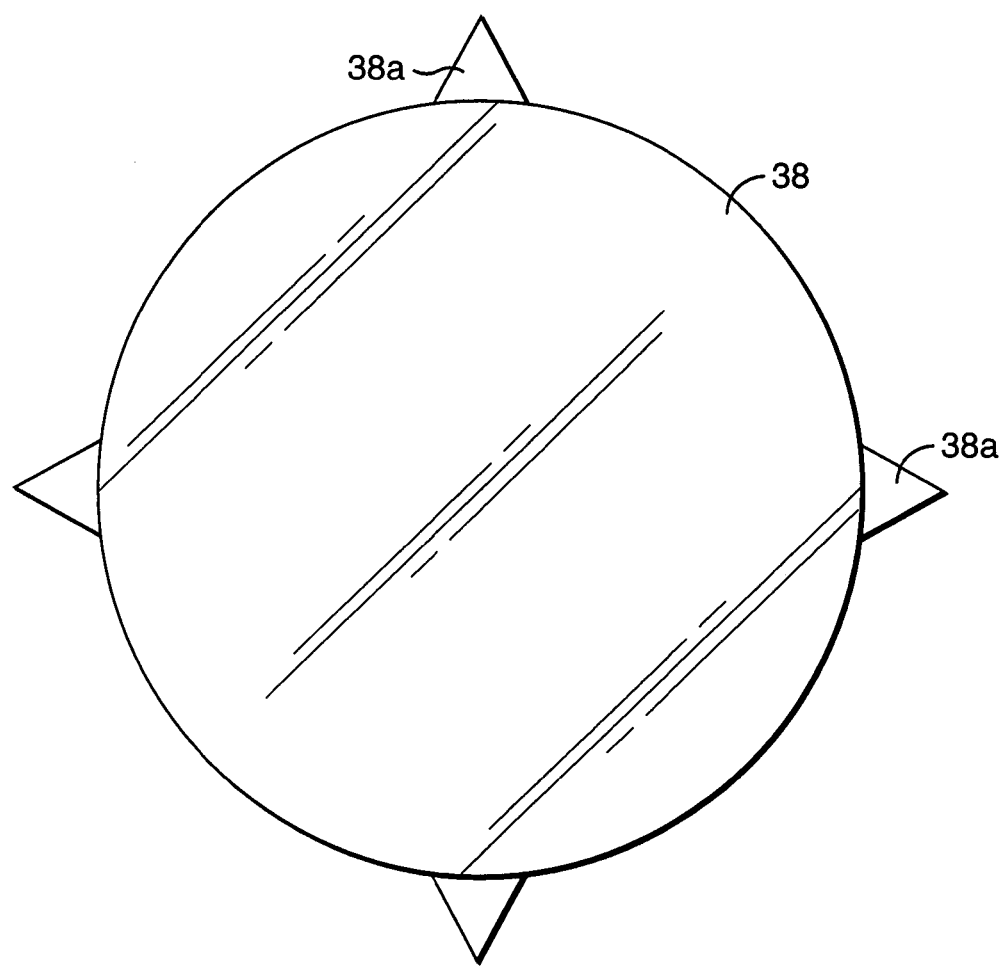
FIG. 5 is an enlarged plan view of the peripheral barbs.

The unitary guide 24 further includes a base 34 with a planar portion 36 and a base coupling 38. The first power input lead 16, the second power input lead 20 and the base 34 all have portions in a substantially common plane for mutual mounting to a common support 100, which can be a printed circuit board having conductive solder traces 102 thereon. The base coupling 38 is formed to frictionally engage a recess 110 in support 100 to form an anchor for the LED assembly and preferably includes peripheral barbs 38a (see, FIG. 5) to aid in the frictional engagement. The unitary light guide 24 includes upper and lower portions 40, 42 that maintain electrical isolation between the first and second power input leads 16 and 20, as illustrated in FIG. 1.

In the embodiment shown in FIG. 1 the power input leads 16 and 20 include offset projections 17, 21, respectively, to contact the conductive solder traces 102.

Figure 4:
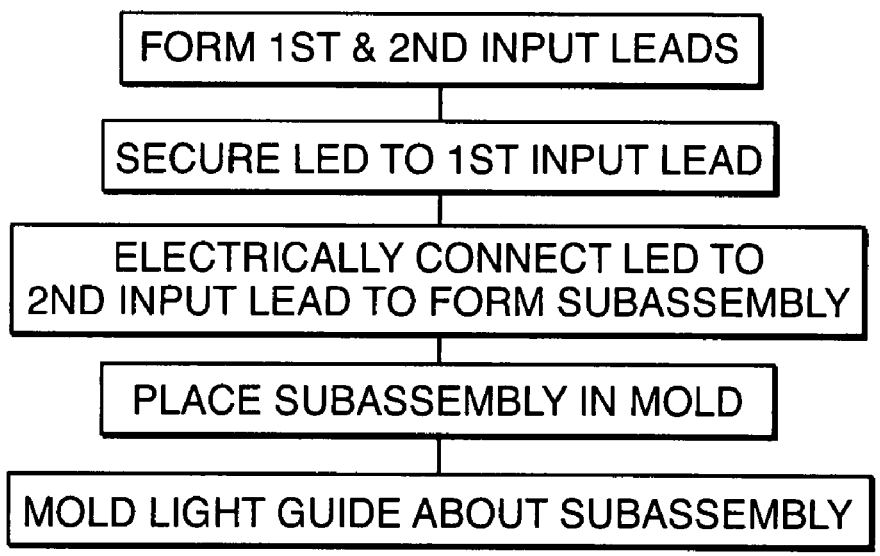
FIG. 4 is a flow diagram of the steps in carrying out an embodiment of the invention.

To achieve the zero light gap relationship between the output window 14 of the LED 12 and the input window 30 of the unitary light guide 24 (see, FIG. 1), the process illustrated in FIG. 4 is employed.

That is, the first and second power input leads 16 and 20 are formed with an electrically isolating region 51 between them. A first pole, for example 18, of an LED 12 is attached to the first power input lead 16 and the second pole 22 of the LED 12 is attached to the second power lead 20, for example, via a gold wire 23 to form a subassembly.

The subassembly is then fed into a mold and an optically clear, transparent epoxy molding compound is applied into the mold at a low-pressure fill rate to maintain the integrity of the wire bond and to form the unitary LED light guide assembly 10. A preferred optically clear compound is HYSOL® MG97 available from LOCTITE Corporation.

This process of molding the light guide input to integrally envelope the LED insures a zero-light gap relationship between the output surface 14 of the LED 12 and the input window 30 of the light guide 24. The relationship is fixed and is not subject to misalignment during subsequent handling. The integral support 32 encompasses both the upper and lower surfaces of the power input leads to further maintain alignment and the integral base 34 and base coupling 38 insure proper engagement with the printed circuit board.

Figure 2:
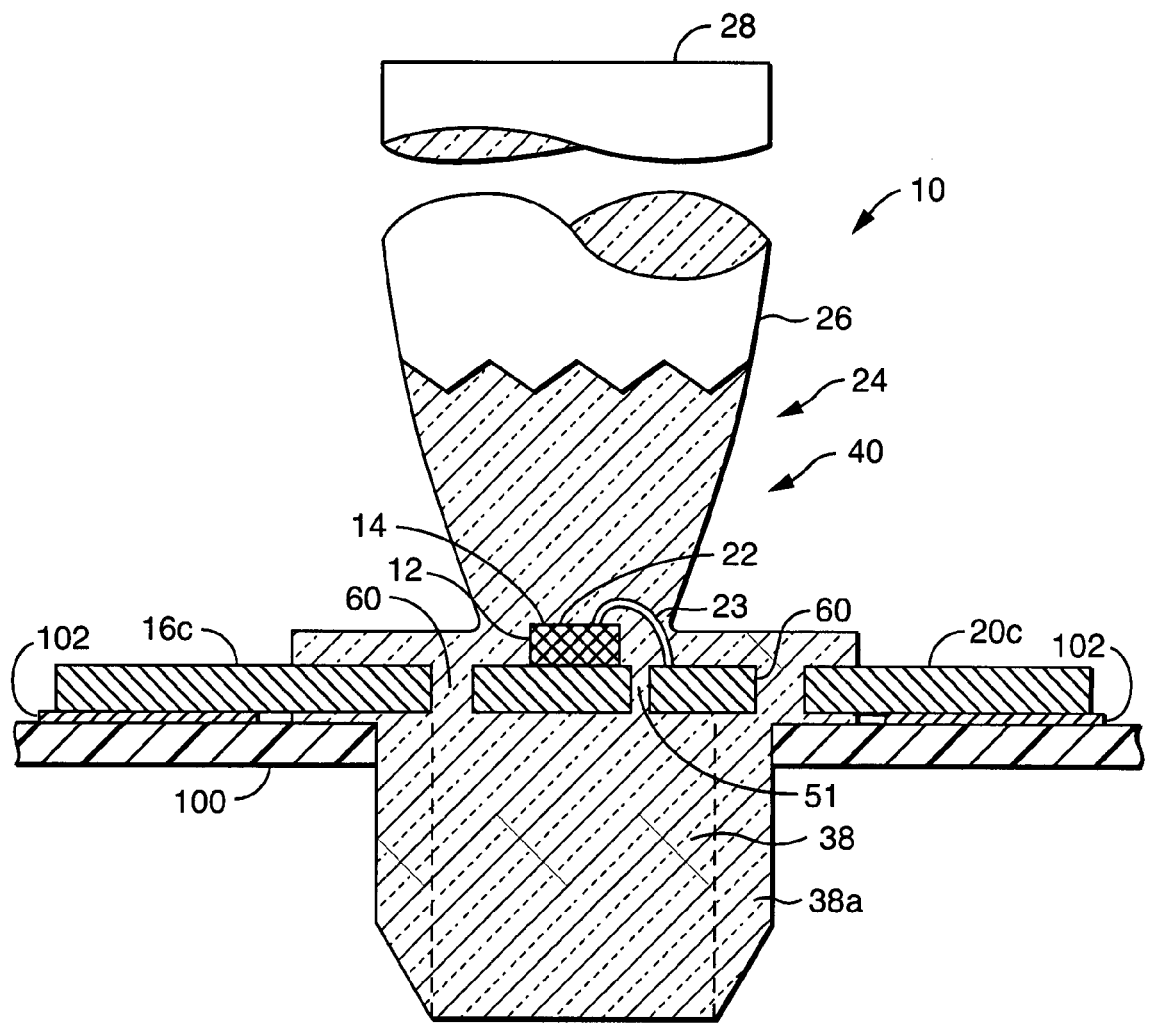
FIG. 2 is an enlarged, diagrammatic, sectional view of an alternate embodiment of the invention.
Figure 3:
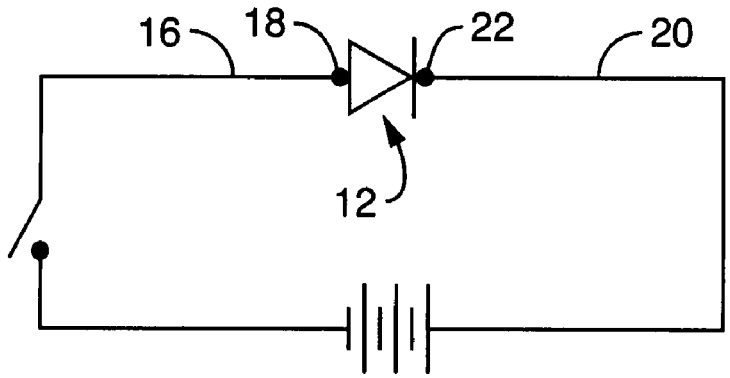
FIG. 3 is a circuit diagram of an embodiment of the invention.

An alternate embodiment of the invention is shown in FIG. 2 wherein power input leads 16c and 20c are formed as planar members. As shown in FIG. 2 (and applicable to the embodiment of FIG. 1) multiple apertures 60 can be formed in the power input leads to allow penetration of the epoxy molding compound to further secure leads into a unit.

After being mounted to a substrate such as a printed circuit board, the unit can be sent through a solder re-flow process to secure electrically and mechanically the unit to the substrate.

There is thus provided an LED and light guide assembly that provides a zero-gap lighting relationship between the LED chip and the light guide that passes all or substantially all of the LED-emitted light. Alignment is maintained through all subsequent handling because of the unitary construction, While there have been shown and described what are at present considered to be the preferred embodiments of the invention, it will be apparent to those skilled in the art that various changes and modifications can be made herein without departing from the scope of the invention as defined by the appended claims.

What is claimed is:

1. A method of making a unitary LED and light guide assembly (10) comprising the steps of:
    forming first and second electrically isolated power input leads (16, 20);
    securing an LED (12) with an output surface (14) to one of said first and second electrically isolated power input leads;
    electrically connecting said LED to the other of said electrically isolated power input leads to form a subassembly (50);
    placing said subassembly (50) in a mold; and
    molding a unitary light guide (24) about said subassembly (50) and further including the steps of providing said unitary light guide (24) with an axially extending, light transmissive guide body (26) using total internal reflection, said guide body (26) having a light output window (28), an input window (30) formed to capture substantially all the light emitted by the LED (12) at said output surface (14); and
    molding the unitary light guide (24) about said subassembly (50) to provide an integral support (32) enveloping at least a portion of a first surface (16a) and a second surface (16b) of said first power input lead (16) and a first surface (20a) and a second surface (20b) of said second power input (lead 20) to anchor said guide body (26) with respect to the electrically isolated power inputs (16, 20) and molding a base coupling (38) formed to frictionally engage a recess (110) in a substrate (100).

2. An LED and light guide assembly (10) for mounting to a substrate (100), comprising:
    an LED (12) with an output surface (14);
    a first power input lead (16) electrically coupled to a first pole (18) of said LED (12) and having a first surface (16a) and a second surface (16b);
    a second power input lead (20) electrically coupled to a second pole (22) of said LED (12) and having a first surface (20a) and a second surface (20b); and
    a unitary, molded light guide (24) comprising;
    a light output window (28);
    an input window (30) axially spaced from said output window (28) and being aligned to capture substantially all the light emitted by the LED (12) at said output surface (14); and
    an axially extending, light transmissive, light guide body (26) using total internal reflection and a support (32) integral with said light guide body (26), said support (32) enveloping at least a portion of said first surface (16a) and said second surface (16b) of said first power input lead (16) and said first surface (20a) and said second surface (20b) of said second power input lead (20) to anchor the light guide body (26) with respect to said power inputs leads (16, 20) and wherein said unitary, molded light guide (24) includes a base coupling (38) formed to frictionally engage a recess (110) in said substrate (100) to form an anchor for the LED assembly (10).

3. The LED and light guide assembly (10) of claim 2 wherein said LED (12) is coupled to said light guide (24) in a zero loss light-gap relationship.

4. The LED and light guide assembly (10) of claim 2 wherein said substrate (100) is a printed circuit board.

5. The LED and light guide assembly (10) of claim 2 wherein said base coupling (38) includes a plurality of peripheral barbs (38a).

* * * * *